(12) United States Patent  
Saeki

(10) Patent No.: US 7,167,016 B2  
(45) Date of Patent: Jan. 23, 2007

(54) OPERATION MODE SETTING CIRCUIT

(75) Inventor: Yukihiro Saeki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 11/062,796

(22) Filed: Feb. 23, 2005

(65) Prior Publication Data

US 2005/0204218 A1 Sep. 15, 2005

(30) Foreign Application Priority Data

Feb. 26, 2004 (JP) ............................. 2004-051016

(51) Int. Cl.
    *H03K 19/00* (2006.01)
(52) U.S. Cl. ........................... 326/16; 326/38; 702/120
(58) Field of Classification Search ................. 326/16, 326/37, 38, 46; 702/117, 120; 365/201
    See application file for complete search history.

(56) References Cited

U.S. PATENT DOCUMENTS

| | | | |
|---|---|---|---|
| 5,559,744 A | 9/1996 | Kuriyama et al. | |
| 5,870,342 A * | 2/1999 | Fukuda | 365/201 |
| 5,905,690 A * | 5/1999 | Sakurai et al. | 365/233 |
| 6,269,038 B1 * | 7/2001 | Itou et al. | 365/201 |
| 6,289,469 B1 * | 9/2001 | Sakata et al. | 713/600 |
| 6,343,048 B1 * | 1/2002 | Jung | 365/233 |
| 6,472,902 B1 | 10/2002 | Seki et al. | |
| 6,651,022 B1 * | 11/2003 | Endo | 702/117 |
| 6,809,975 B1 * | 10/2004 | Yamaoka et al. | 365/201 |
| 2004/0032915 A1 * | 2/2004 | Park et al. | 375/324 |
| 2006/0107082 A1 * | 5/2006 | Matsuoka et al. | 713/323 |

FOREIGN PATENT DOCUMENTS

| | | |
|---|---|---|
| JP | 2000-30446 | 1/2000 |
| JP | 2001-273054 | 10/2001 |

* cited by examiner

*Primary Examiner*—Don Le  
(74) *Attorney, Agent, or Firm*—Oblon, Spivak, McClelland, Maier & Neustadt, P.C.

(57) ABSTRACT

According to the present invention, there is provided an operation mode setting circuit comprising:
  a plurality of latch circuits each of which receives one of at least two bits contained in an operation mode setting signal for setting an operation mode, and latches and outputs the bit in synchronism with a clock;
  an inverter which inverts at least one of output signals from said latch circuits; and
  a logic circuit which receives the output signals from said latch circuits and the signal inverted by said inverter, performs a predetermined logic operation, and outputs a result.

18 Claims, 8 Drawing Sheets

| MODE BIT0 | MODE BIT1 | MODE BIT2 | MODE BIT3 | OPERATION MODE |
|---|---|---|---|---|
| 0 | 0 | 0 | 0 | NORMAL OPERATION |
| 1 | 0 | 0 | 1 | TEST MODE A |
| 0 | 1 | 0 | 1 | TEST MODE B |
| 0 | 0 | 1 | 1 | TEST MODE C |

FIG. 6

OPERATION MODE SETTING CIRCUIT

CROSS REFERENCE TO RELATED APPLICATION

This application is based upon and claims benefit of priority under 35 USC §119 from the Japanese Patent Application No. 2004-51016, filed on Feb. 26, 2004, the entire contents of which are incorporated herein by reference.

BACKGROUND OF THE INVENTION

The present invention relates to an operation mode setting circuit and, more particularly, to a circuit which sets an operation mode immediately after the power supply is turned on in a semiconductor integrated circuit.

A semiconductor integrated circuit generally has an integrated circuit dedicated to testing and includes a test mode different from a normal operation mode, in order to facilitate testing.

Since, however, the test mode is different from the normal operation mode, a user does not operate the semiconductor integrated circuit in this test mode. Therefore, if the test mode starts for some reason while the user is operating the semiconductor integrated circuit, this test mode is regarded as an operation error.

Accordingly, design of a semiconductor integrated circuit requires some "mechanism" which prevents switching to the test mode while a user is normally operating the semiconductor integrated circuit.

As an example of this "mechanism", FIG. 5 shows the arrangement of a conventional circuit for setting an operation mode.

4-bit operation mode setting signals "mode bits 0 to 3" are input to four test mode input terminals IN101 to IN104 from a CPU or another external circuit (neither is shown). A normal operation mode and test mode are switched by the combination of these 4-bit signals.

FIG. 6 shows operation modes determined by the combination of the 4-bit operation mode setting signals.

In a normal operation mode, all mode bits 0 to 3 take the value of logic "0". To enter any of test modes A to C, mode bit 3 takes the value of logic "1". Each test mode is determined by the combination of logics "1" and "0" in remaining mode bits 0, 1, and 2.

Since a user is forced to fixedly use logic "0" in all mode bits 0 to 3, the semiconductor integrated circuit does not enter any test mode by mistake.

The operation of the conventional operation mode setting circuit will be described below with reference to FIG. 5.

Of mode bits 0 to 3 input to the input terminals IN101 to IN104, mode bits 0 and 3 remain the same, and mode bits 1 and 2 are inverted by inverters IV101 and IV102, respectively, and input to an AND circuit AD101. The output from the AND circuit AD101 is supplied to a latch circuit LC101. At a timing synchronized with a clock CLK supplied from a clock generator CG101, the latch circuit LC101 latches and outputs the output from the AND circuit AD101. This output is output from an output terminal OT101 to, e.g., a CPU (not shown).

If the output from the AND circuit AD101 is logic "1", the operation mode is test mode A. If the output is logic "0", the operation mode is any of the normal operation mode and test modes B to D. Note that in the following explanation, test mode A is used as the test mode, and a case in which it is necessary to distinguish between the normal operation mode and test mode A will be described.

The following is a reference which discloses a technique concerning the conventional operation mode setting circuit.

Japanese Patent Laid-Open No. 2001-273054

Unfortunately, the conventional operation mode setting circuit described above has the following problems.

Immediately after the power supply is turned on, the output level of the latch circuit LC101 is unstable, and the output is either logic "1" or "0".

This is so because the clock CLK which is required to latch the data into the latch circuit LC101 is not generated immediately after the power supply is turned on.

The clock CLK is not generated until all circuits in the semiconductor integrated circuit become normally operable, i.e., until a quartz oscillator of the clock generator CG101 which generates the clock CLK becomes stably operable in the semiconductor integrated circuit after the power supply is turned on.

To eliminate this phenomenon which occurs immediately after the power supply is turned on, a power on clear circuit POC is added to force the output from the latch circuit to "0".

FIG. 7 shows an example in which the power on clear circuit POC is added to the latch circuit LC101 shown in FIG. 5.

When the power supply is turned on, the power on clear circuit POC outputs a pulse while the power supply voltage rises. This pulse is supplied to a reset terminal R of the latch circuit LC101, and the output from the latch circuit LC101 is fixed to "0".

Consequently, after the power supply is turned on, the semiconductor integrated circuit enters the normal operation mode, and does not switch to test mode A.

Even in this arrangement including the power on clear circuit POC as described above, however, it is sometimes impossible to eliminate the above-mentioned phenomenon in which the output from the latch circuit LC101 is unstable after the power supply is turned on. The reason will be explained below.

The power on clear circuit POC senses the rise of the power supply voltage, and generates one pulse accordingly. Therefore, the characteristics of the power on clear circuit POC are largely influenced by the rise time of the power supply voltage.

As shown in FIG. 8, a power on clear circuit generally has a capacitor C, resistor R, and switching transistor T. As shown in FIG. 9, after a power supply voltage VDD rises, the power on clear circuit generates a pulse POCP by discharging the capacitor C.

If the power supply voltage VDD rises slowly, the generated pulse POCP peaks at an insufficient height, so the output from the latch circuit LC101 cannot be reset in some cases.

Accordingly, the output from the latch circuit LC101 sometimes becomes logic "1" after the power supply is turned on. Once this output becomes "1", this "1" output state cannot be reset unless the clock CLK is supplied to the clock terminal L.

As a consequence, the semiconductor integrated circuit enters test mode A. However, this is an operation error to the user, and increases the possibility of a defective operation in the user system.

To prevent this event, it is necessary to define a maximum value of the rise time of the power supply voltage to reliably execute this operation. In addition, the user must design the system board such that the rise time is equal to or smaller than this maximum value. This operation is cumbersome for the user, and increases the cost.

SUMMARY OF THE INVENTION

According to one aspect of the present invention, there is provided an operation mode setting circuit, comprising:

a plurality of latch circuits each of which receives one of at least two bits contained in an operation mode setting signal for setting an operation mode, and latches and outputs the bit in synchronism with a clock;

an inverter which inverts at least one of output signals from said latch circuits; and a logic circuit which receives the output signals from said latch circuits and the signal inverted by said inverter, performs a predetermined logic operation, and outputs a result.

According to one aspect of the present invention, there is provided an operation mode setting circuit, comprising:

a plurality of latch circuits each of which receives one of at least two bits contained in operation mode setting signals for setting an operation mode, and latches and outputs the bit in synchronism with a clock;

an input inverter which inverts at least one of the operation mode setting signals input to said latch circuits, and supplies an inverted signal to a corresponding one of said latch circuits;

an output inverter which inverts at least one of output signals from said latch circuits; and a logic circuit which receives the output signals from said latch circuits and the signal inverted by said inverter, performs a predetermined logic operation, and outputs a result, wherein said latch circuits include a latch circuit having said input inverter on an input side and no output inverter on an output side, and a latch circuit having no input inverter on an input side and said output inverter on an output side.

BRIEF DESCRIPTION OF THE DRAWINGS

FIG. 6 is a view showing the values of bits 0 to 3 of operation mode setting signals for selecting any of a normal operation mode and test modes A to C;

DETAILED DESCRIPTION OF THE INVENTION

Embodiments of the present invention will be described below with reference to the accompanying drawings.

(1) First Embodiment

Figure 1:
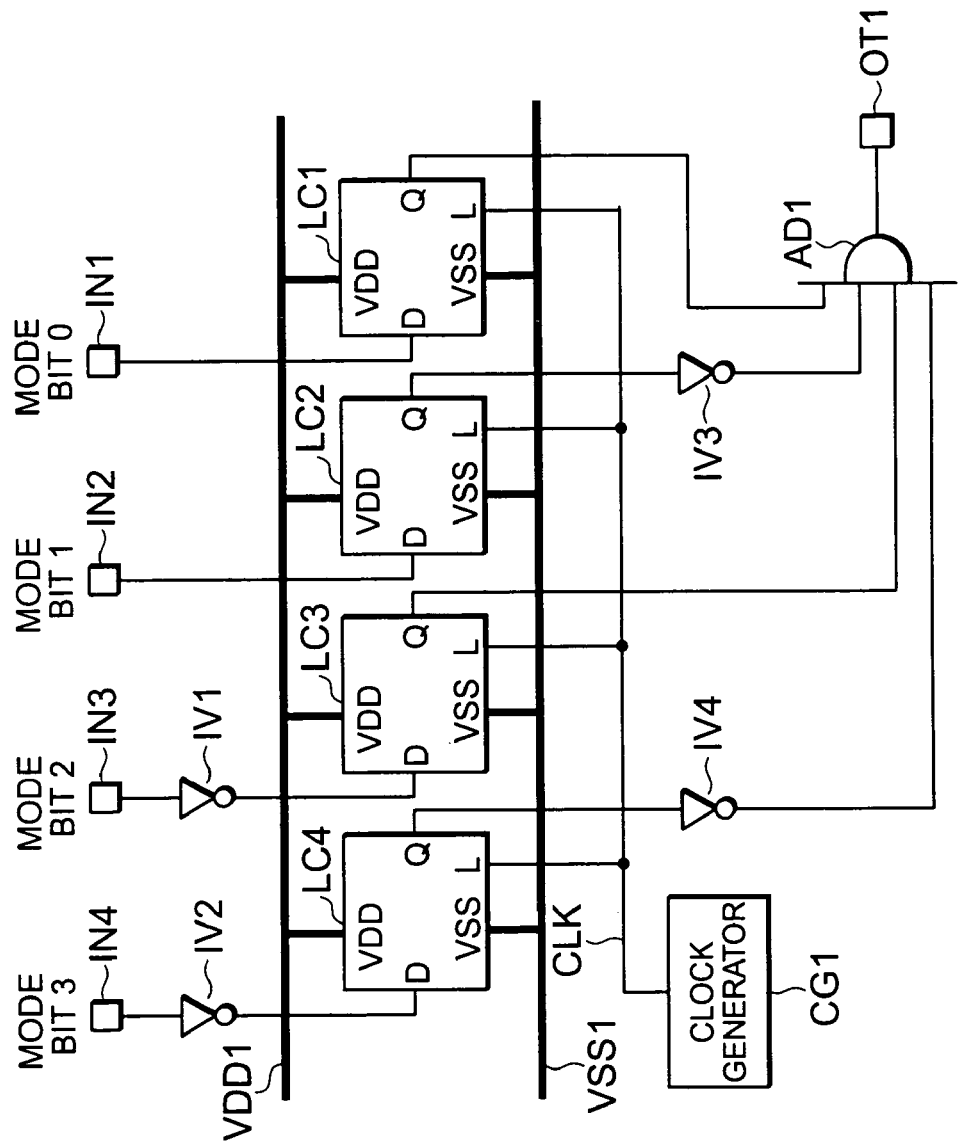
FIG. 1 is a circuit diagram showing the arrangement of an operation mode setting circuit according to the first embodiment of the present invention.

FIG. 1 shows the arrangement of an operation mode setting circuit according to the first embodiment of the present invention.

Figure 4:
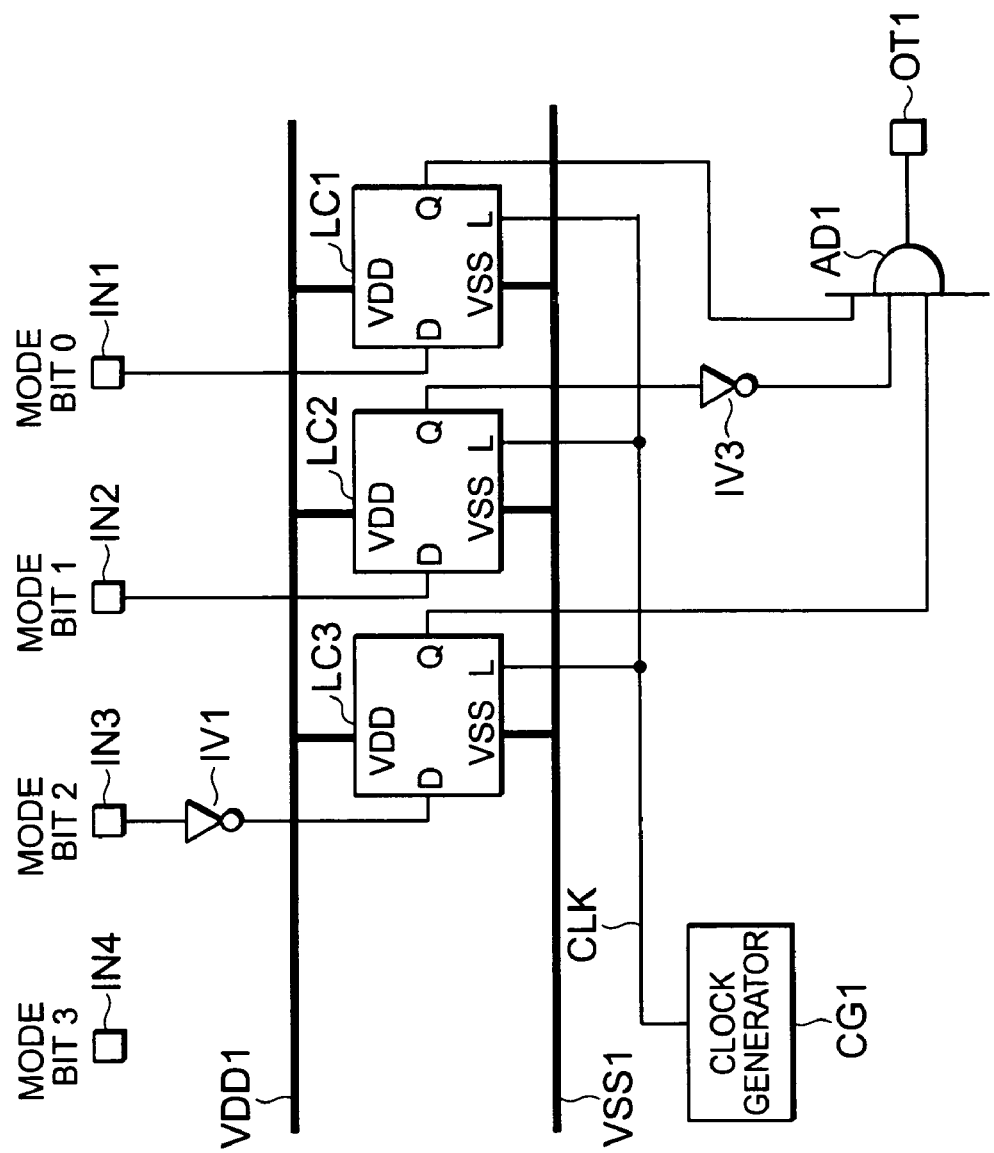
FIG. 4 is a circuit diagram showing the arrangement of an operation mode setting circuit according to the fourth embodiment of the present invention.
Figure 5:
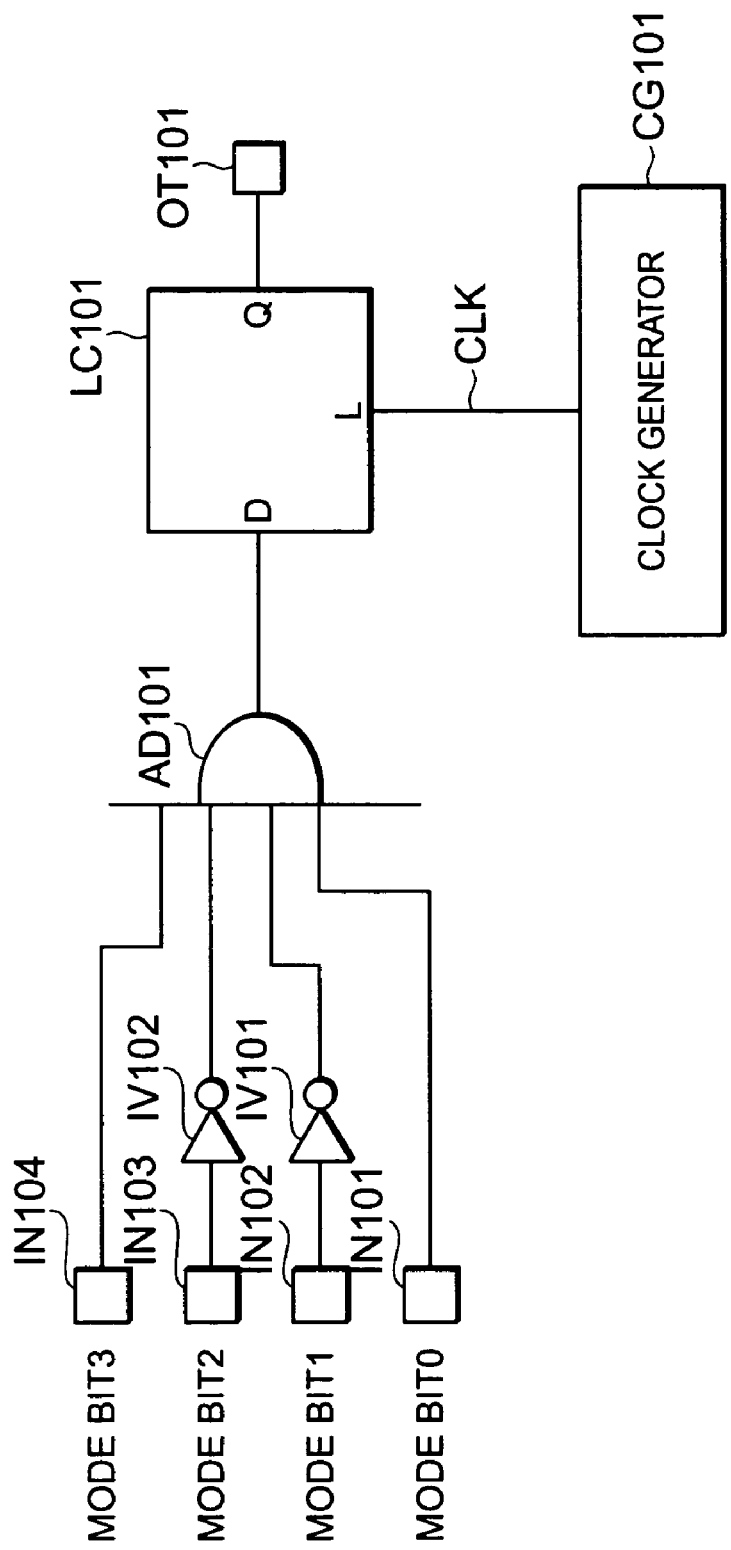
FIG. 5 is a circuit diagram showing the arrangement of a conventional operation mode setting circuit according to the first embodiment of the present invention.
Figure 7:
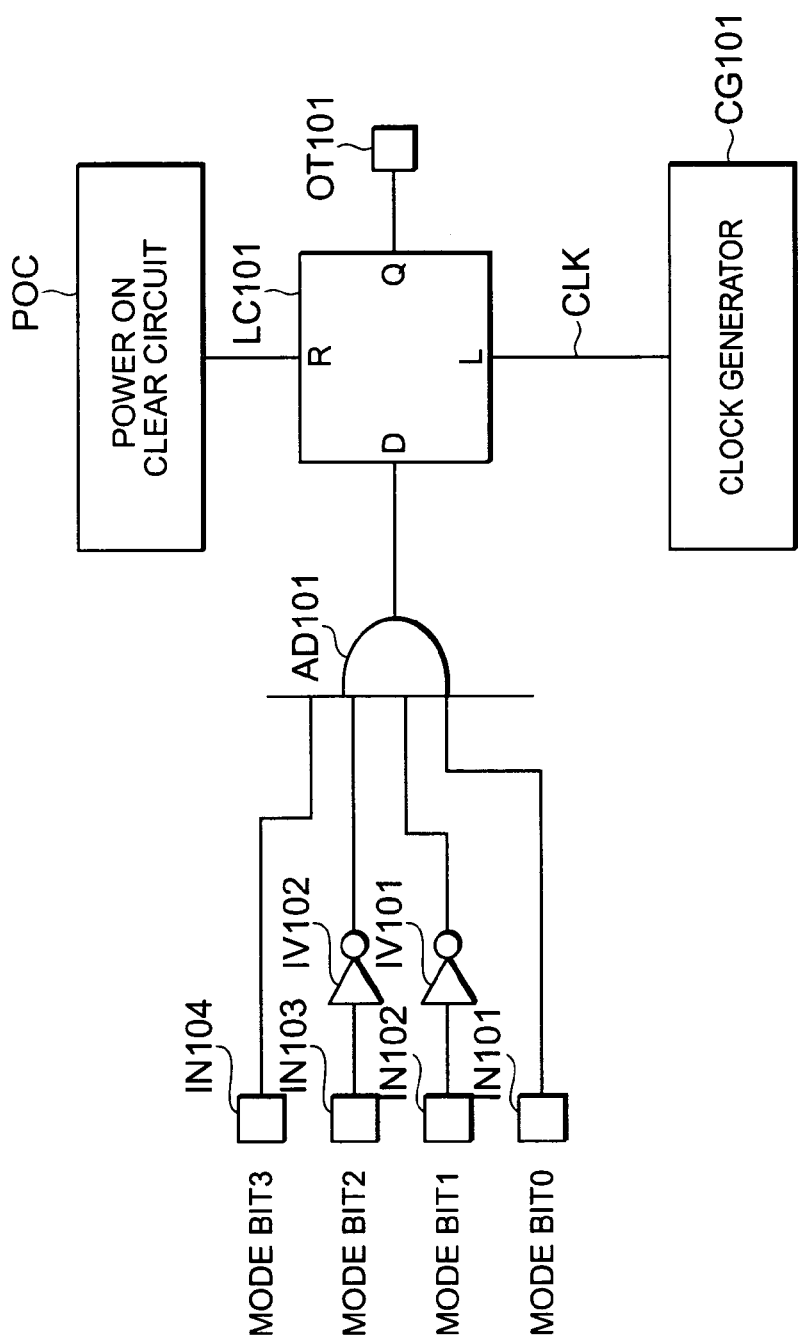
FIG. 7 is a circuit diagram showing the arrangement of another conventional operation mode setting circuit.
Figure 8:
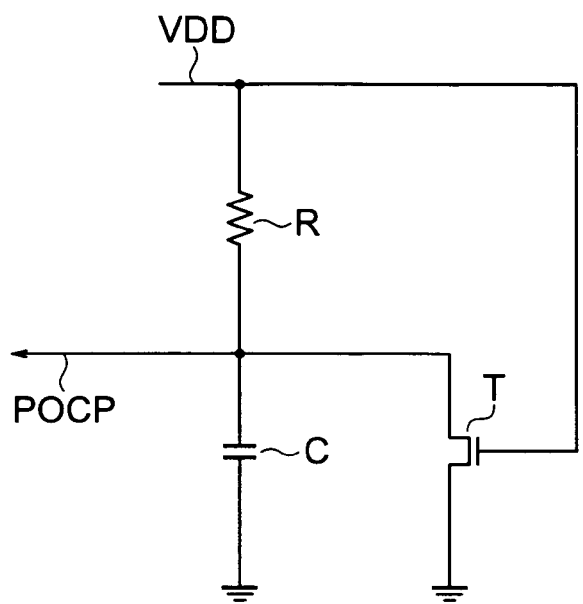
FIG. 8 is a circuit diagram showing the arrangement of the power on clear circuit shown in FIG. 7.
Figure 9:
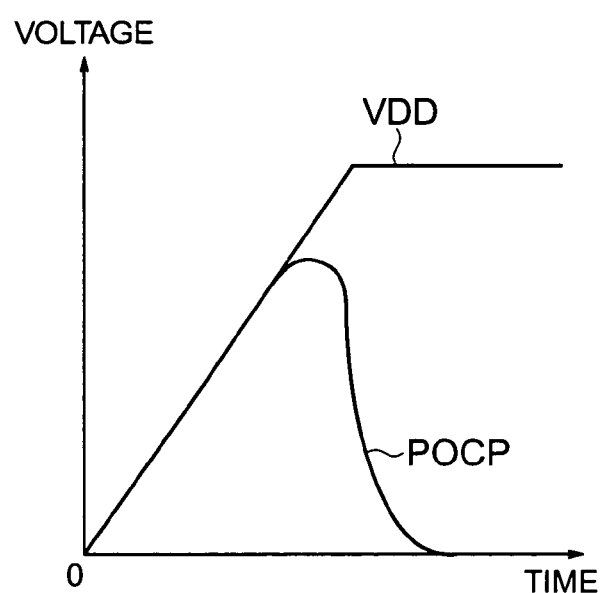
FIG. 9 is a graph showing the relationship between a pulse generated by the power on clear circuit shown in FIG. 8 and the power supply voltage.

As in the circuit shown in FIG. 4, an operation which, when the power supply is turned on, distinguishes between a normal operation mode and test mode A by using operation mode setting signals having four mode bits 0 to 3 shown in FIG. 5 will be explained below.

In the first embodiment, latch circuits LC1 to LC4 are arranged in one-to-one correspondence with four mode bits 0 to 3 of the operation mode setting signals.

The latch circuits LC1 to LC4 are connected to a common power supply voltage line VDD1 and common ground voltage line VSS1.

Mode bits 0 to 3 are input to input terminals IN1 to IN4, and mode bits 0 and 1 are directly input to data terminals D of the latch circuits LC1 and LC2, respectively. Mode bits 2 and 3 are inverted by inverters IV1 and IV2, respectively, and input to data terminals D of the latch circuits LC3 and LC4, respectively.

A clock CLK generated by a clock generator CG1 is supplied to the latch circuits LC1 to LC4, and used as a signal for defining a data latch timing.

Of the latch circuits LC1 to LC4, the outputs from the latch circuits LC1 and LC3 to which mode bits 0 and 2, respectively, are input are directly input to an AND circuit AD1. The outputs from the latch circuits LC2 and LC4 to which mode bits 1 and 3, respectively, are input are inverted by inverters IV3 and IV4, respectively, and input to the AND circuit AD1. The AND circuit AD1 ANDs the input data, and outputs the result from an output terminal OT1.

When operation mode setting signals (mode bits 0, 1, 2, 3) =(0, 0, 0, 0) for setting the normal operation mode are input, (0, 0, 1, 1) is input to the latch circuit LC1. When the clock CLK is supplied, the latch circuit LC1 latches this data, and the output from the latch circuit LC1 is also (0, 0, 1, 1). When input to the AND circuit AD1, this output is inverted to (0, 1, 1, 0) by the inverters IV3 and IV4. Consequently, logic "0" is output from the AND circuit AD1.

On the other hand, when operation mode setting signals (mode bits 0, 1, 2, 3)=(1, 0, 0, 1) for setting test mode A are input, (1, 0, 1, 0) is input to the latch circuit LC1. When the clock CLK is supplied, the latch circuit LC1 latches this data, and the output from the latch circuit LC1 is also (1, 0, 1, 0). When input to the AND circuit AD1, this output is inverted to (1, 1, 1, 1) by the inverters IV3 and IV4. Consequently, logic "1" is output from the AND circuit AD1.

Accordingly, when logic "0" is output from the AND circuit AD1, the operation mode switches to the normal operation mode; when logic "1" is output, the operation mode switches to test mode A.

The operation mode setting circuit of the first embodiment having the above arrangement can eliminate the operation error concerning mode selection immediately after turning on of the power supply as described above. The operation of the first embodiment will be described below.

First, assume that the four latch circuits LC1 to LC4 are equivalent circuits having substantially the same circuit configuration and layout.

Assume also that in the semiconductor integrated circuit, the four latch circuits LC1 to LC4 are arranged adjacent to each other or arranged as closely as possible.

The latch circuits LC1 to LC4 are connected the same branch lines from the common power supply voltage line VDD1 and common ground voltage line VSS1 respectively. Note that both the power supply voltage line VDD1 and ground voltage line VSS1 need not always be common lines, i.e., only one of them need be a common line.

Note also that the four latch circuits LC1 to LC4 are arranged in ascending order of mode bit weight, i.e., in the order of mode bits 0, 1, 2, and 3.

A case in which the power supply voltage VDD is raised in the circuit configuration and layout as described above will be explained below.

As described above, the outputs from the latch circuits LC1 to LC4 are unstable immediately after the power supply is turned on. However, it is experimentally known that the latch circuits LC1 to LC4 output the same data when they have the same configuration and layout and they are connected to the same power supply line VDD1 and same ground voltage line VSS1.

Accordingly, the outputs from the latch circuits LC1 to LC4 are expected to be (mode bits 0, 1, 2, 3)=(0, 0, 0, 0) or (1, 1, 1, 1). In this case, (0, 1, 1, 0) or (1, 0, 0, 1) is output to the AND circuit AD1. That is, since the data of logic "0" is always input, the output is logic "0", so it is ensured that the operation mode switches not to test mode A but to the normal operation mode.

This is so because on the output side of the latch circuits LC1 to LC4, the latch circuits LC1 and LC3 having no inverters and the latch circuits LC2 and LC4 having the inverters IV3 and IV4, respectively, are present.

It is difficult to predict whether the outputs from the latch circuits LC1 to LC4 become (0, 0, 0, 0) or (1, 1, 1, 1). However, these outputs presumably largely depend on the way how the power supply voltage VDD rises.

That is, the outputs from the latch circuits LC1 to LC4 can be (0, 0, 0, 0) or (1, 1, 1, 1) depending on the way the power supply voltage VDD rises. Accordingly, depending on the physical positional relationship between the latch circuits LC1 to LC4, "1" and "0" may be mixed, i.e., (0, 0, 1, 1), (1, 1, 0, 0), or the like may be output after the power supply is turned on.

Even in this case, however, a plurality of "1"s or "0"s often continue, and a run of alternate complementary values such as (0, 1, 0, 1) or (1, 0, 1, 0) extremely rarely occurs, so the possibility of occurrence of such run can be regarded as substantially zero.

In the first embodiment as described above, to separately detect at least two specific codes "e.g., (0, 0, 0, 0) for setting the normal operation mode and (1, 0, 0, 1) for setting the test mode", the operation mode switches to the normal operation mode if all the outputs from the latch circuits adjacent to each other are the same immediately after the power supply is turned on, and to test mode A if these outputs are complementary values. Accordingly, it is possible to reliably prevent switching to test mode A by mistake immediately after turning on of the power supply.

(2) Second Embodiment

Figure 2:
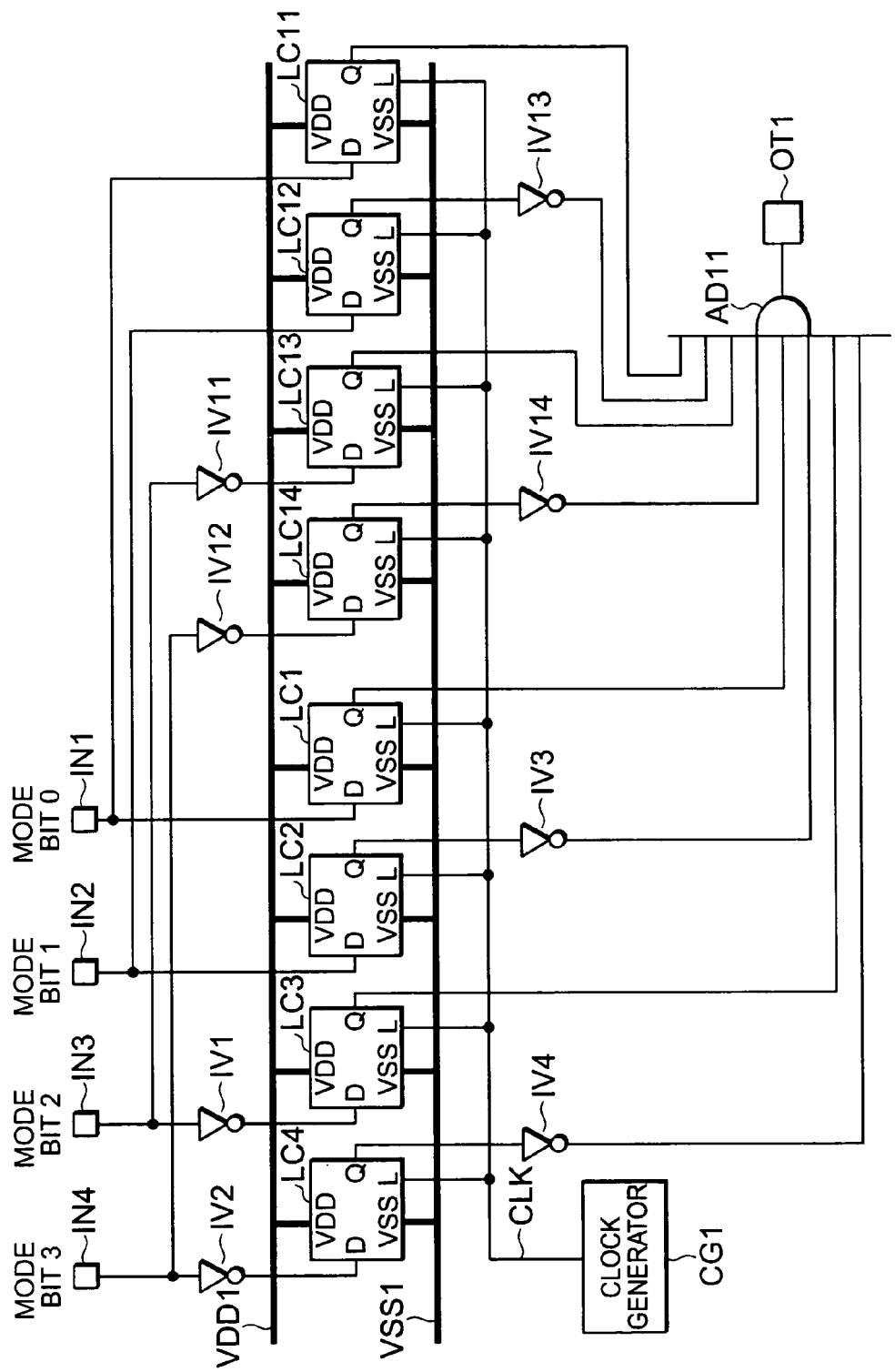
FIG. 2 is a circuit diagram showing the arrangement of an operation mode setting circuit according to the second embodiment of the present invention.

A semiconductor integrated circuit according to the second embodiment of the present invention will be described below with reference to FIG. 2.

The second embodiment is equivalent to increasing the number of latch circuits so as to be able to prevent an operation error at higher probability than that of the first embodiment.

In addition to four latch circuits LC1 to LC4 and four inverters IV1 to IV4 of the first embodiment shown in FIG. 1, the second embodiment includes four latch circuits LC11 to LC14 and four inverters IV11 to IV14 having the same connection relationship as in the first embodiment. Also, the 4-input AND circuit AD1 is replaced with an 8-input AND circuit AD11. Other components, i.e., input terminals IN1 to IN4, an output terminal OT1, and a clock generator CG1 are denoted by the same reference symbols as in the first embodiment, and an explanation thereof will be omitted.

As in the first embodiment, the four latch circuits LC1 to LC4 are equivalent circuits having substantially the same circuit configuration and layout, and are arranged adjacent to each other or arranged as close as possible in the semiconductor integrated circuit.

Likewise, the four latch circuits LC11 to LC14 are equivalent circuits having substantially the same circuit configuration and layout, and are arranged adjacent to each other or arranged as close as possible in the semiconductor integrated circuit.

The latch circuits LC11 to LC14 are connected to branch lines from a common power supply voltage line VDD1 and common ground voltage line VSS1.

Also, as in the first embodiment, the four latch circuits LC1 to LC4 are arranged in ascending order of mode bit weight, i.e., in the order of mode bits 0, 1, 2, and 3.

Likewise, the four latch circuits LC11 to LC14 are arranged in ascending order of mode bit weight, i.e., in the order of mode bits 0, 1, 2, and 3.

An operation performed by the second embodiment having the above arrangement immediately after a power supply voltage VDD is raised will be explained below.

As described in the first embodiment, the outputs from the latch circuits LC1 to LC4 and LC11 to LC14 are unstable immediately after the power supply is turned on. However, it is experimentally known that the latch circuits LC1 to LC4 and LC11 to LC14 having the same configuration and layout and connected to the same power supply line VDD1 and same ground voltage line VSS1 output the same data at high probability.

Accordingly, it is expected that the latch circuits LC1 to LC4 output (mode bits 0, 1, 2, 3)=(0, 0, 0, 0) or (1, 1, 1, 1), and the latch circuits LC11 to LC14 similarly output (mode bits 0, 1, 2, 3)=(0, 0, 0, 0) or (1, 1, 1, 1).

In this case, the AND circuit AD11 receives (0, 1, 1, 0) or (1, 0, 0, 1) output from the latch circuits LC1 to LC4 via the inverters IV3 and IV4, respectively, and (0, 1, 1, 0) or (1, 0, 0, 1) output from the latch circuits LC11 to LC14 via the inverters IV13 and IV14, respectively.

That is, the AND circuit AD11 receives (0, 1, 1, 0) and (0, 1, 1, 0), (1, 0, 0, 1) and (1, 0, 0, 1), or (0, 1, 1, 0) and (1, 0, 0, 1). In either case, the AND circuit AD11 outputs logic "0", and this makes reliable switching to a normal operation mode possible.

Switching to the normal operation mode fails and test mode A starts only when all the outputs from the latch circuits LC1 to LC4 and LC11 to LC14 complementarily continue, i.e., only when (0, 1, 0, 1, 0, 1, 0, 1) is output.

Immediately after the power supply is turned on, the outputs from the latch circuits extremely rarely take these values by accident, so the possibility can be regarded as substantially zero.

Accordingly, the second embodiment can avoid an operation error immediately after the power supply is turned on more reliably than in the first embodiment.

Note that in the second embodiment, the two sets (eight bits) of the latch circuits LC1 to LC4 and LC11 to LC14 are used for operation mode setting signals having four bits (mode bits 0 to 3). However, it is also possible to increase the number of latch circuits to three sets (12 bits), four sets (16 bits), . . . , and so on.

(3) Third Embodiment

Figure 3:
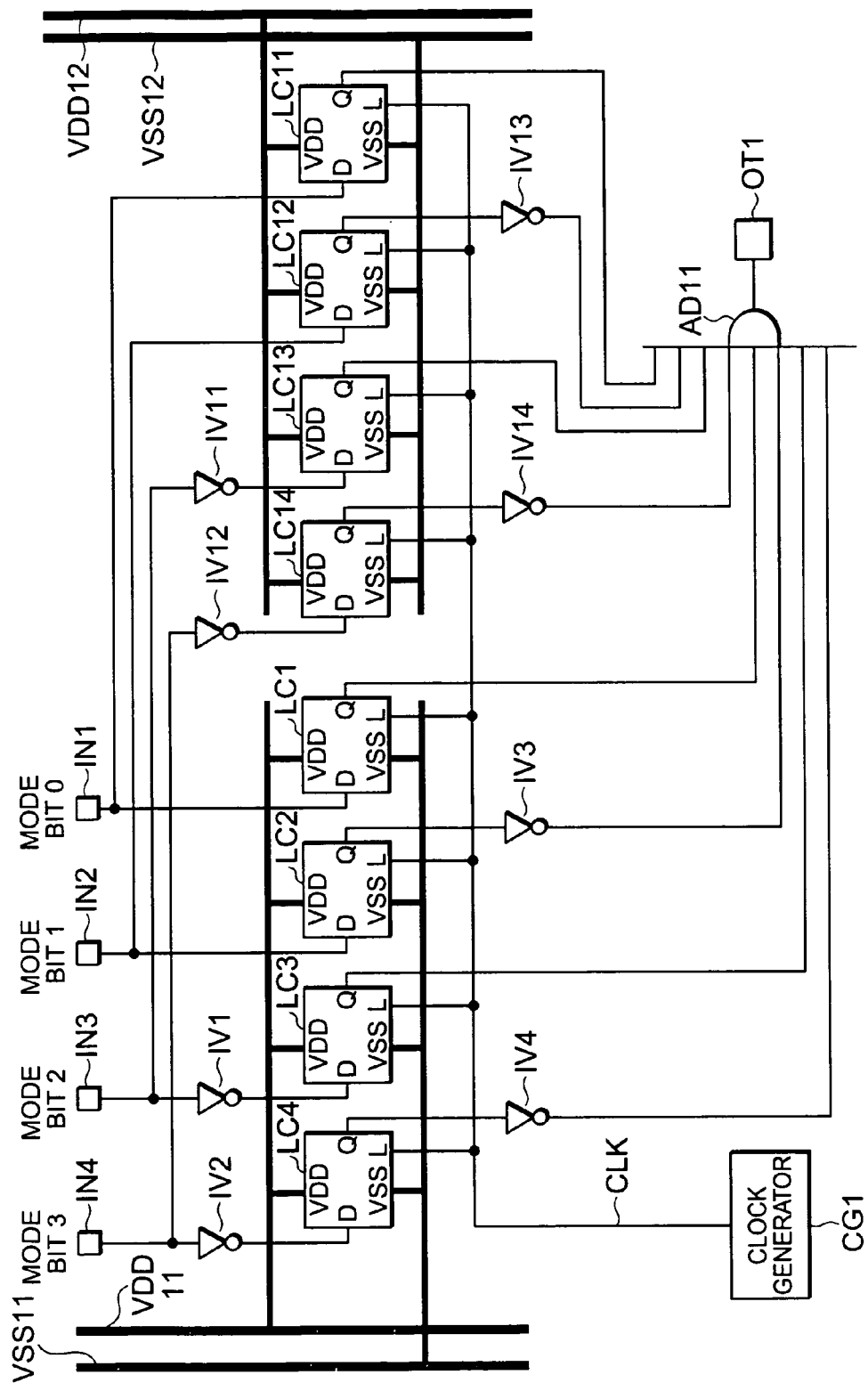
FIG. 3 is a circuit diagram showing the arrangement of an operation mode setting circuit according to the third embodiment of the present invention.

The third embodiment of the present invention will be described below with reference to FIG. 3.

In the second embodiment described above, all the latch circuits LC1 to LC4 and LC11 to LC14 are connected to branch lines of the common power supply voltage line VDD1 and ground voltage line VSS1.

This arrangement has a high space efficiency because all the components can be integrated in a specific portion on the chip. However, in this specific region on the chip, the probability of switching to test mode A can be relatively higher than those in other regions.

By contrast, in the third embodiment, latch circuits LC1 to LC4 are connected to branch lines of a power supply voltage line VDD11 and ground voltage line VSS11, and latch circuits LC11 to LC14 are connected to branch lines of a power supply voltage line VDD12 and ground voltage line VSS12.

In this arrangement, no components need be integrated in a specific region on the chip, so the probability of an operation error is dispersed independently of any specific region. As a consequence, the operation mode can stably proceed to a normal operation mode.

(4) Fourth Embodiment

The fourth embodiment of the present invention will be described below with reference to FIG. 4.

The first embodiment described earlier includes the latch circuits LC1 to LC4 for all the four bits of the operation mode setting signals. Also, each of the second and third embodiments includes the latch circuits LC1 to LC4 and LC11 and LC14 for eight bits.

It is, however, unnecessary to prepare latch circuits for all bits of operation mode setting signals. In the fourth embodiment shown in FIG. 4, for 4-bit operation mode setting signals (mode bits 0 to 3), latch circuits LC1 to LC3 are prepared for mode bits 0 to 2, and no latch circuit is prepared for mode bit 3.

The data of mode bits 0 and 1 is directly input to the latch circuits LC1 and LC2, and the data of mode bit 2 is inverted by an inverter IV1 and then input to the latch circuit LC3. The data of mode bit 3 is not used in signal processing, although the data is input to an input terminal IN4.

In synchronism with a clock CLK, the data latched in the latch circuits LC1 to LC3 is output. Of the output data, only the output from the latch circuit LC2 is inverted by an inverter IV3, and then input to an AND circuit AD1.

Only when the latch circuits LC1 to LC3 output complementary values (mode bits 0, 1, 2, 3)=(0, 1, 0) at a very low probability, the AND circuit AD1 outputs logic "1" to proceed to test mode A. If all these values are the same, a normal operation mode starts. Therefore, it is possible to reliably prevent an operation error concerning operation mode setting immediately after turning on of the power supply in the fourth embodiment as well.

In this embodiment as described above, the individual bits of the operation mode setting signals are input from input terminals IN1 to IN4. Mode bits 0 and 1 are directly input to the latch circuits LC1 and LC2, respectively, and mode bits 2 and 3 are directly input to the latch circuits LC3 and LC4, respectively. In synchronism with the clock CLK, mode bits 0 and 2 are directly output to the AND circuit AD1, and mode bits 1 and 3 are inverted and then input to the AND circuit AD1. The AND circuit AD1 ANDs these mode bits.

Immediately after the power supply is turned on, all the latch circuits LC1 to LC4 presumably output "1"s or "0"s at high probability. However, in the operation mode setting circuit of the above embodiment, mode bits 2 and 3 of these outputs are complementarily inverted by the inverters IV3 and IV4, respectively. In this manner, at least one mode bit is inverted by the inverter, and the outputs from the latch circuits and the signal inverted by the inverter are ANDed. This makes it possible to distinguish between a case in which all the latch circuits output the same value (immediately after the power supply is turned on) and a case in which they do not. Consequently, it is possible to reliably prevent an operation error concerning operation mode setting, i.e., switching to a test mode by mistake immediately after turning on the power supply.

Each of the above embodiments is merely an example, and does not limit the present invention. Therefore, these embodiments can be variously modified.

The invention claimed is:

1. An operation mode setting circuit comprising:
   a plurality of latch circuits each of which receives one of at least two bits contained in an operation mode setting signal for setting an operation mode, and latches and outputs the bit in synchronism with a clock;
   an inverter which inverts at least one of output signals from said latch circuits; and
   a logic circuit which receives the output signals from said latch circuits and the signal inverted by said inverter, performs a predetermined logic operation, and outputs a result wherein said inverter is arranged such that values of the output signals from said latch circuits make at least one complementary combination in accordance with a bit order of the operation mode setting signal.

2. A circuit according to claim 1, wherein said latch circuits have electrically equivalent configurations, and are arranged adjacent to each other in accordance with a bit order of the operation mode setting signal.

3. A circuit according to claim 2, wherein said inverter is arranged such that values of the output signals from said latch circuits make at least one complementary combination in accordance with a bit order of the operation mode setting signal.

4. A circuit according to claim 1, wherein said latch circuits are electrically connected to a common power supply voltage line and/or a common ground voltage line.

5. A circuit according to claim 2, wherein said latch circuits are electrically connected to a common power supply voltage line and/or a common ground voltage line.

6. A circuit according to claim 1, wherein
   the operation mode setting signal has first to nth (n is an integer of not less than 2) bits, and
   m (m is an integer of not less than 1) sets of n latch circuits formed in one-to-one correspondence with the first to nth bits are arranged, each of said n latch circuits is being given one bit of the operation mode setting signal.

7. A circuit according to claim 1, wherein when all the input signals have the same value, said logic circuit outputs a signal for switching to a normal operation mode.

8. A circuit according to claim 2, wherein when all the input signals have the same value, said logic circuit outputs a signal for switching to a normal operation mode.

9. A circuit according to claim 1, wherein said logic circuit outputs a signal for switching to a test mode, only in a case in which the input signals have a predetermined combination of values except for a case in which all the input signals have the same value.

10. An operation mode setting circuit comprising:
a plurality of latch circuits each of which receives one of at least two bits contained in operation mode setting signals for setting an operation mode, and latches and outputs the bit in synchronism with a clock;
an input inverter which inverts at least one of the operation mode setting signals input to said latch circuits, and supplies an inverted signal to a corresponding one of said latch circuits;
an output inverter which inverts at least one of output signals from said latch circuits; and
a logic circuit which receives the output signals from said latch circuits and the signal inverted by said inverter, performs a predetermined logic operation, and outputs a result,
wherein said latch circuits include a latch circuit having said input inverter on an input side and no output inverter on an output side, and a latch circuit having no input inverter on an input side and said output inverter on an output side wherein said input inverter and output inverters are arranged such that values of the output signals from said latch circuits make at least one complementary combination in accordance with a bit order of the operation mode setting signals.

11. A circuit according to claim 10, wherein said latch circuits have electrically equivalent configurations, and are arranged adjacent to each other in accordance with a bit order of the operation mode setting signal.

12. A circuit according to claim 11, wherein said input inverter and output inverter are arranged such that values of the output signals from said latch circuits make at least one complementary combination in accordance with a bit order of the operation mode setting signals.

13. A circuit according to claim 11, wherein said latch circuits are electrically connected to a common power supply voltage line and/or a common ground voltage line.

14. A circuit according to claim 12, wherein said latch circuits are electrically connected to a common power supply voltage line and/or a common ground voltage line.

15. A circuit according to claim 11, wherein
the operation mode setting signal has first to nth (n is an integer of not less than 2) bits, and
m (m is an integer of not less than 1) sets of n latch circuits formed in one-to-one correspondence with the first to nth bits are arranged, each of said n latch circuits is being given one bit of the operation mode setting signal.

16. A circuit according to claim 11, wherein when all the input signals have the same value, said logic circuit outputs a signal for switching to a normal operation mode.

17. A circuit according to claim 12, wherein when all the input signals have the same value, said logic circuit outputs a signal for switching to a normal operation mode.

18. A circuit according to claim 11, wherein said logic circuit outputs a signal for switching to a test mode, only in a case in which the input signals have a predetermined combination of values except for a case in which all the input signals have the same value.

* * * * *